United States Patent [19]
Hynes et al.

[11] Patent Number: 6,068,202
[45] Date of Patent: May 30, 2000

[54] SPRAYING AND DISPENSING APPARATUS

[75] Inventors: Anthony Joseph Hynes, Ballston Spa; Richard John Bievenue, Burnt Hills, both of N.Y.

[73] Assignee: Precision Valve & Automotion, Inc., Halfmoon, N.Y.

[21] Appl. No.: 09/151,044

[22] Filed: Sep. 10, 1998

[51] Int. Cl.$^7$ ........................................................ B05D 5/10
[52] U.S. Cl. ........................... 239/290; 239/436; 118/323; 118/241
[58] Field of Search ..................... 239/290, 436; 118/323, 241; 427/96, 426

[56] References Cited

U.S. PATENT DOCUMENTS

| | | |
|---|---|---|
| 1,661,150 | 2/1928 | Birkenmaier . |
| 2,544,123 | 3/1951 | Andersson . |
| 4,171,096 | 10/1979 | Welsh et al. . |
| 4,544,100 | 10/1985 | Simashkevich et al. . |
| 4,661,368 | 4/1987 | Rohde et al. . |
| 4,789,104 | 12/1988 | Anderson . |
| 4,809,885 | 3/1989 | Hayashi et al. . |
| 4,844,348 | 7/1989 | Rutz . |
| 4,880,663 | 11/1989 | Shimada . |
| 4,922,852 | 5/1990 | Price ........................................ 118/323 |
| 4,987,854 | 1/1991 | Hall ........................................... 118/323 |
| 5,183,322 | 2/1993 | Haruch ..................................... 239/394 |
| 5,190,219 | 3/1993 | Copp, Jr. . |
| 5,251,823 | 10/1993 | Joshi et al. . |
| 5,294,459 | 3/1994 | Hogan et al. ............................. 427/96 |
| 5,409,733 | 4/1995 | Boger et al. . |
| 5,429,840 | 7/1995 | Raterman et al. . |
| 5,551,391 | 9/1996 | Beck et al. . |
| 5,707,010 | 1/1998 | Manfre et al. . |

*Primary Examiner*—Charles R. Eloshway
*Attorney, Agent, or Firm*—Schmeiser, Olsen & Watts

[57] ABSTRACT

A spraying and dispensing apparatus that provides both spraying and dispensing from a single compact apparatus. The present invention includes a valve assembly attached to a pneumatic slide assembly. Included in the valve assembly are a valve main body, comprising an air body and a fluid control body, and an air atomizing body. The air body includes a system for controlling a fluid control needle to regulate the flow of material provided to a fluid dispenser needle. The pneumatic slide assembly includes a pneumatic slide to selectively position an outlet of the fluid dispenser needle within the atomizing air body for spraying, or outside of the atomizing air body for dispensing.

25 Claims, 4 Drawing Sheets

SPRAYING AND DISPENSING APPARATUS

FIELD OF THE INVENTION

The present invention relates generally to systems for depositing a material onto a surface, and more particularly, to spraying and dispensing devices used to coat circuit boards in the conformal coating industry.

BACKGROUND OF THE INVENTION

There are two basic forms of coatings that are typically applied to circuit boards. These coatings include beads of material applied to specific locations on the circuit board, and substantially uniform thickness coatings applied over large sections of the circuit board. The coatings may comprise a wide variety of materials such as ultraviolet (UV) acrylic gels, moisture and thermal cure silicones, and the like.

The coatings are typically applied to a circuit board using devices such as spray guns, spray nozzles, or dispensing nozzles. For spraying, such devices generally include a liquid spray material that is atomized by compressed air and is then directed toward the surface to be coated. For dispensing, such devices generally include a pressurized liquid material that is dispensed through a nozzle tip in close proximity to the surface being coated.

In many applications, including the coating of a circuit board, both a spraying and a dispensing device are required. The spraying and dispensing devices are commonly attached to an apparatus, such as a multi-degree of freedom robotic positioning apparatus, that provides accurate positional displacement relative to the article being coated.

Having two separate devices, one for spraying and one for dispensing, however, greatly increases the complexity and cost of the coating process. Also, since the spraying and dispensing devices are generally mounted on opposing sides of a single arm of the robotic positioning apparatus, the surface area that is accessible is limited by the interference of one or both of the devices at the boundaries of the positioning apparatus. Production setup time and maintenance time are also increased, and, if spraying and dispensing is required at the same location on the surface, the time required to reposition the spraying and dispensing devices is increased.

SUMMARY OF THE INVENTION

In order to overcome the above deficiencies, the present invention provides a spraying and dispensing apparatus that provides both spraying and dispensing from a single compact apparatus. The present invention includes a valve assembly attached to a pneumatic slide assembly. The valve assembly includes a valve main body and an air atomizing body. The valve main body of the valve assembly includes an air body and a fluid control body.

In the air body of the valve main body, a piston is attached to a fluid control needle. The fluid control needle protrudes from the air body and enters into the fluid control body where the tip of the fluid control needle is received in a valve seat. Pressurized air is selectively applied to the top or the bottom of the piston causing the piston to move in an upward or downward direction, thereby causing the tip of the fluid control needle to move into or out of the valve seat.

In the fluid control body, material to be applied to a surface is supplied in a fluid form. The material flow is controlled by the location of the tip of the fluid control needle. When pressurized air is applied to the top of the piston in the air body, the fluid control needle is moved in a downward direction until the tip of the fluid control needle is fully seated in the valve seat, thereby stopping the flow of material. When pressurized air is applied to the bottom of the piston in the air body, the tip of the fluid control needle is moved upward out of the valve seat, allowing material to flow through the valve seat into a fluid dispenser needle which protrudes from a bottom of the fluid control body. In addition, the fluid dispenser needle is received in a central through bore hole in the air atomizing body.

For dispensing, the pneumatic slide assembly lowers the valve main body until an outlet of the fluid dispenser needle passes through the air atomizing body and is positioned in close proximity to the circuit board surface.

Pressurized air is applied to the bottom of the piston in the air body causing the tip of the fluid control needle to move out of the valve seat, allowing material to flow through the outlet of the fluid dispenser needle onto the surface of the circuit board.

For spraying, the pneumatic slide assembly raises the valve main body until the outlet of the fluid dispenser needle is located within the atomizing air body.

Pressurized air is applied to the bottom of the piston, thereby displacing the tip of the fluid control needle out of the valve seat and allowing material to flow through the outlet of the fluid dispenser needle. Compressed air is supplied to the atomizing air body to atomize the fluid passing out of the outlet of the fluid dispenser needle into a spray. The atomizing air body can be configured to produce round, fan shaped, or other types of spray patterns.

Thus, unlike prior art systems, spraying and dispensing functions have been combined in one assembly. Spraying and dispensing can be selectively actuated by displacing the outlet of the fluid dispenser needle into or out of an air atomizing body using a pneumatic slide assembly.

Generally, the present invention provides a spraying and dispensing apparatus comprising:

a system for discharging material through an outlet; and
a positioning system for positioning the outlet of the material discharging system in a first location for spraying the material onto a surface, and for positioning the outlet of the material discharging system in a second location for dispensing the material onto the surface.

The present invention further provides a method for spraying and dispensing material from an outlet of a material discharging system, comprising the steps of:

positioning the outlet of the material discharging system in a first location to spray the material from the outlet; and
positioning the outlet of the material discharging system in a second location to dispense the material from the outlet.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
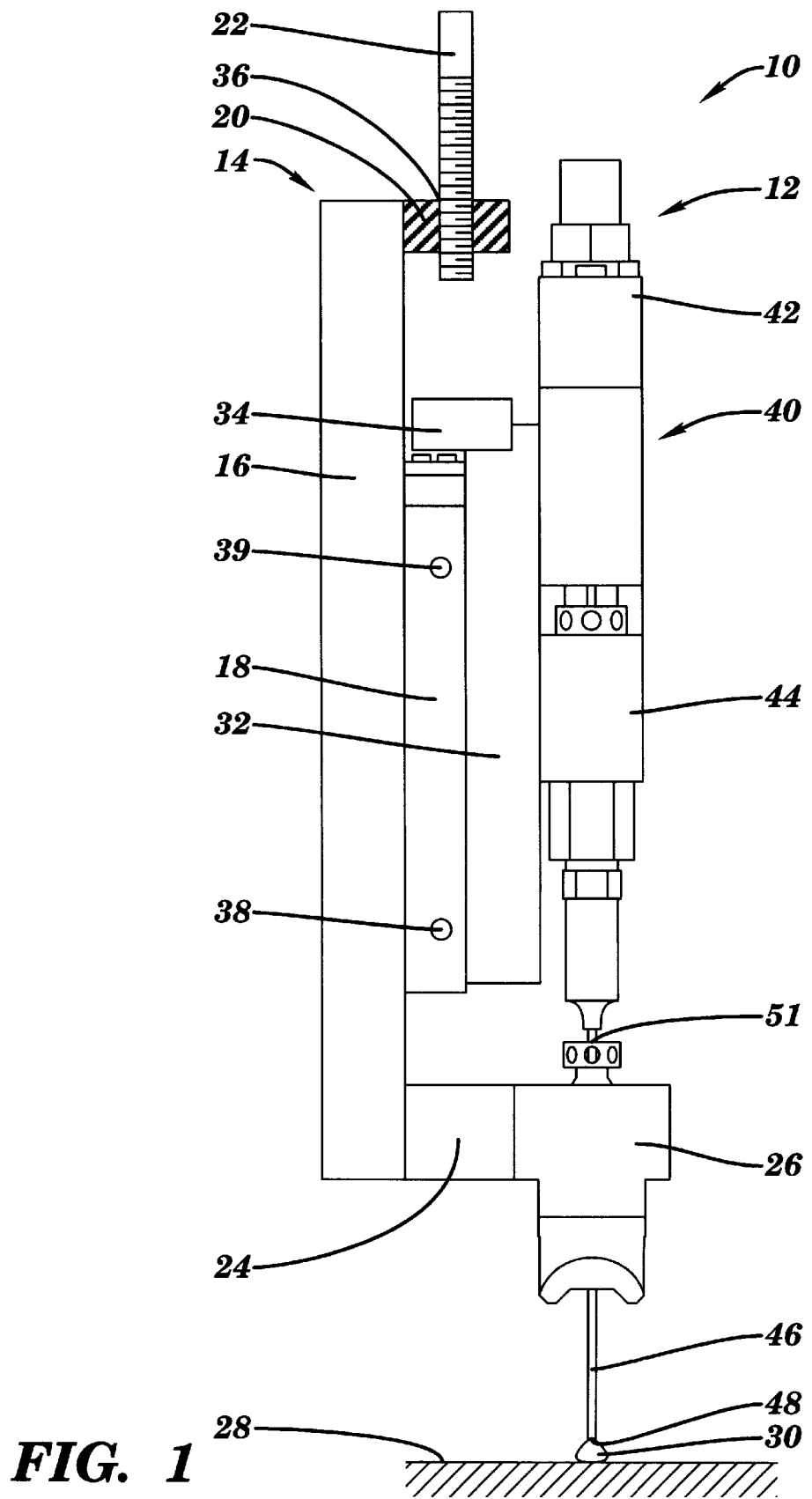
FIG. 1 is a front elevational view of a first embodiment of a spraying and dispensing apparatus in accordance with a preferred embodiment of the present invention, wherein the spraying and dispensing apparatus is in a dispensing position.

The features and advantages of the present invention are illustrated in detail in the accompanying drawings, wherein like reference numerals refer to like elements throughout the drawings.

Referring to FIG. 1, there is illustrated a front elevational view of a preferred embodiment of a spraying and dispensing apparatus 10 in accordance with the present invention. The spraying and dispensing apparatus 10 generally includes a valve assembly 12 attached to a pneumatic slide assembly 14. The pneumatic slide assembly 14 is configured to vertically displace the valve assembly 12 to select between a spraying and a dispensing operation.

The pneumatic slide assembly 14 includes a main support 16 having a pneumatic slide support 18 fixedly mounted thereon. A stroke adjust block 20 and stroke adjust member 22 are mounted to an upper section of the main support 16. An atomizing air body mounting block 24 is fixed to a lower section of the main support 16. An atomizing air body 26 is attached to the main support 16 by the atomizing air body mounting block 24, such that the atomizing air body 26 remains stationary relative to the main support 16. For positional movement relative to a surface 28 on which fluid material 30 is being deposited, the pneumatic slide assembly 14 is preferably attached by the main support 16 to a multi-degree of freedom, positional robotic apparatus (not shown).

A pneumatic slide 32 is movably mounted to the pneumatic slide support 18, and can be selectively displaced in a upward or downward position relative to the main support 16. The pneumatic slide 32 may be provided with a rail that rides within a corresponding slot formed in the pneumatic slide support 18. Other systems that allow the pneumatic slide 32 to be displaced relative to the pneumatic slide support 18 may also be used without departing from the intended scope of the present invention.

A strike plate 34 is rigidly attached to a top portion of the pneumatic slide 32. The upward displacement of the pneumatic slide 32 relative to the main support 16 is limited by the engagement of the strike plate 34 attached to the top portion of the pneumatic slide 32 and the bottom of the stroke adjust member 22. The length of the stroke adjust member 22 extending downward from the stroke adjust block 20 may be adjusted to selectively limit the upward displacement of the pneumatic slide 32. In a preferred embodiment of the present invention, the stroke adjust member 22 comprises a stroke adjust bolt that is threadedly disposed within an aperture 36 formed through the stroke adjust block 20.

Compressed air supplied to a lower air port 38 formed in the pneumatic slide support 18 causes the pneumatic slide 32 to move in an upward direction relative to the main support 16. The upward movement of the pneumatic slide 32 is limited by the engagement of the strike plate 34 attached to a top portion of the pneumatic slide 32 and the bottom of the stroke adjusting member 22. Conversely, compressed air supplied to an upper air port 39 causes the pneumatic slide 32 to move in a downward direction until the lower portion of the strike plate 34 contacts an upper surface of the pneumatic slide support 18.

The valve assembly 12 includes a valve main body 40 and the atomizing air body 26. The valve main body 40 is rigidly attached to the pneumatic slide 32. Accordingly, the valve main body 40 is displaced upward or downward in response to an upward or downward displacement of the pneumatic slide 32.

The valve main body 40 includes an air body 42 and a fluid control body 44. Protruding from the lower portion of the valve main body 40 is a fluid dispenser needle 46 having a needle outlet 48. The fluid dispenser needle 46 is received in a central through bore 51 in the air atomizing body 26.

To dispense fluid material 30 onto the surface 28, the pneumatic slide 32 is displaced in a downward direction by supplying compressed air to the upper air port 39. Since the valve main body 40 is rigidly attached to the pneumatic slide 32, the valve main body 40 and the fluid dispenser needle 46 are also displaced in a downward direction such that the needle outlet 48 passes through and protrudes beyond the atomizing air body 26. After positioning the needle outlet 48 over a desired location on the surface 28, using, e.g., a multi-degree of freedom, positional robotic apparatus or the like, the fluid material 30 is dispensed through the needle outlet 48 onto the surface 28. In FIG. 1, for example, the needle outlet 48 is shown in a dispensing position with fluid material 30 being directly applied to the surface 28. Typically, the spraying and dispensing apparatus 10 is positioned, and the flow of fluid material 30 is controlled, to cause individual drops or a continuous bead pattern to be applied to the surface 28.

Figure 2:
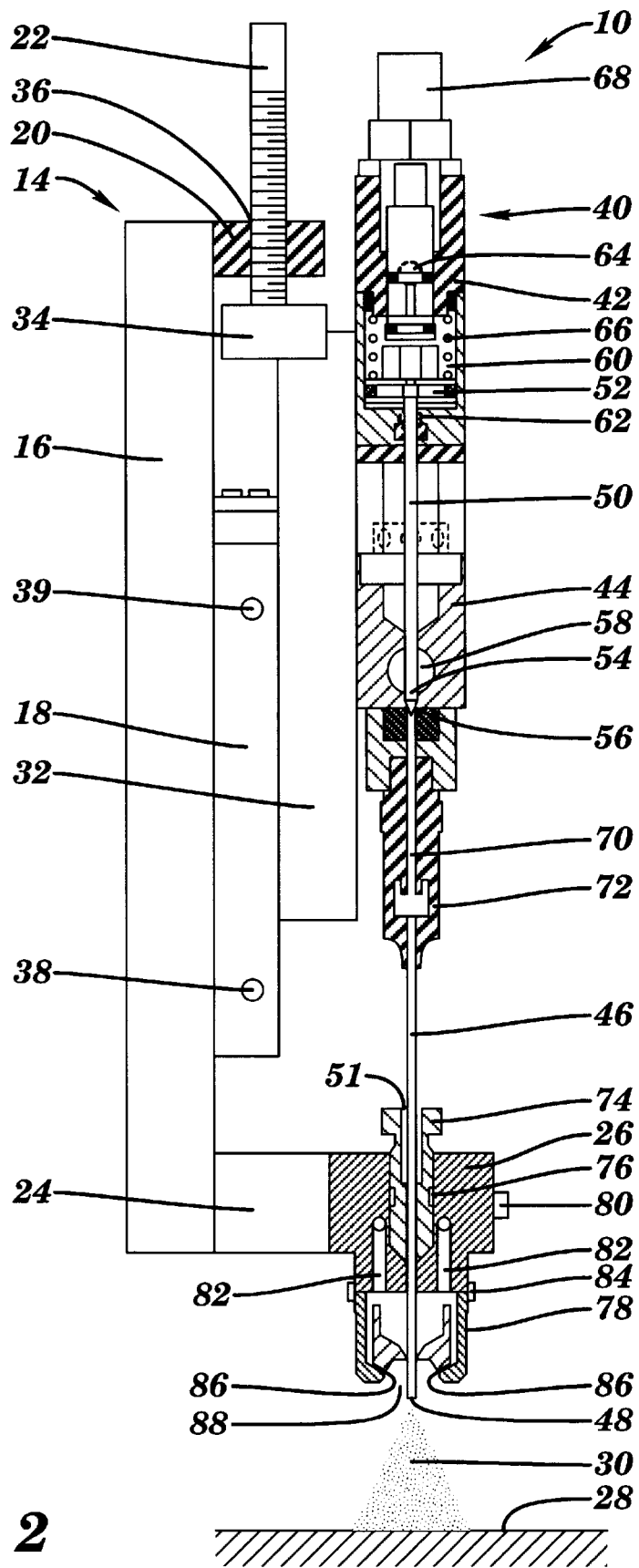
FIG. 2 is a partial cross-sectional view of the spraying and dispensing apparatus of FIG. 1 taken along a substantially axial line, wherein the spraying and dispensing apparatus is in a spraying position.

FIG. 2 is a partial cross-sectional view of the spraying and dispensing apparatus of FIG. 1 taken along a substantially axial line. As shown, the valve main body 40 includes an air body 42 that selectively controls the position of a fluid control needle 50 to release or stop the flow of fluid material 30 into the fluid dispenser needle 46. A movable piston 52 is located in the air body 42 and is attached to an upper end of the fluid control needle 50. The opposing end of the fluid control needle 50 includes a pointed control needle tip 54 which is removably received in a valve seat 56 in the fluid control body 44.

The fluid material 30 is supplied under pressure to the fluid control body 44 through a material inlet port 58. When the pointed control needle tip 54 is displaced downward and is seated within the valve seat 56, the fluid material 30 is prevented from flowing into the fluid dispenser needle 46. When the pointed control needle tip 54 is moved upward, and is no longer seated in the valve seat 56, the fluid material 30 is allowed to flow into the fluid dispenser needle 46.

The fluid control needle 50 is preferably displaced within the air body 42 using compressed air. Other known methods may also be employed. Specifically, the piston 52, which is attached to an end of the fluid control needle 50, is displaced upward within a piston bore 60 in the air body 42 by supplying compressed air to a lower air port 62 in the air body 42. This results in the upward displacement of the fluid control needle 50, and the corresponding removal of the pointed control needle tip 54 of the fluid control needle 50 from the valve seat 56, thereby allowing the fluid material 30 to flow into the fluid dispenser needle 46. Analogously, the piston 52 is displaced downward within the piston bore 60 in the air body 42 by supplying compressed air to an upper air port 64 in the air body 42. In response to the downward displacement of the piston 52, the pointed control needle tip 54 of the fluid control needle 50 is positioned within the valve seat 56, thereby preventing the fluid material 30 from flowing into the fluid dispenser needle 46.

A spring 66 is preferably installed between the top of the piston 52 and the upper interior surface of the piston bore 60. The spring 66 provides a biasing force against the piston 52, such that if no compressed air is supplied to the air ports 62 and 64, the piston 52 will automatically be moved in a downward direction to position the pointed control needle tip 54 of the fluid control needle 50 within the valve seat 56, thereby shutting off the material flow. This provides a fail safe mode, whereby if the unit were to lose compressed air, the material flow would be automatically stopped.

A threaded body stroke adjuster 68 is provided to adjustably limit the upper displacement of the piston 52 and attached fluid control needle 50 to control the amount of fluid material 30 flowing into the fluid dispenser needle 46. A computerized control system (not shown) may also be provided to programmably regulate the threaded body stroke adjuster 68 to control the material flow.

After passing through the valve seat 56, the fluid material 30 flows through a central axial hole 70 of a needle adapter 72 into the fluid dispenser needle 46. The needle adapter 72 connects the fluid dispenser needle 46 to the fluid control body 44. In operation, the fluid material 30 passes through the fluid dispenser needle 46 and is dispensed (FIG. 1) or sprayed (FIG. 2) onto the surface 28 through the needle outlet 48.

The atomizing air body 26 includes a packing nut 74 and packing material 76 to guide and center the fluid dispenser needle 46 within the atomizing air body 26, and to provide a seal to prevent leakage of compressed air from the atomizing air body 26. The atomizing air body 26 further includes a atomizing air cap 78 for producing a desired spray pattern of the fluid material 30 on the surface 28.

Compressed air is supplied to the atomizing air body 26 through an air inlet port 80. The compressed air is supplied to the atomizing air cap 78 through an air passage 82. The atomizing air cap 78 is removably attached to the atomizing air body 26 with a threaded retaining ring 84.

Compressed air from the air inlet port 80 travels through side and central air passages 86 and 88 in the atomizing air cap 78. Typically, the needle outlet 48 is located in close proximity to the outlets of the air passages 86 and 88 to cause atomization of the fluid material 30. Depending on the configuration of the air passages 86 and 88, the atomized fluid material 30 can produce a wide variety of spray patterns on the surface 28.

In FIG. 2, the spraying and dispensing apparatus 10 of the present invention is configured to spray the fluid material 30 onto the surface 28. Specifically, compressed air has been applied to the lower air port 38 in the pneumatic slide support 18 causing the pneumatic slide 32 to be displaced in an upward direction until the strike plate 34 attached to a top portion of the pneumatic slide 32 contacts the bottom of the stroke adjusting member 22. This also displaces the needle outlet 48 of the attached fluid dispenser needle 46 within the atomizing air cap 78. To spray, compressed air is supplied to the air inlet port 80 of the atomizing air body 26 to atomize the fluid material 30 passing out of the needle outlet 48.

In the preferred embodiment of the present invention, the maximum supply pressure of the fluid material 30 is about 3500 psi and the compressed air pressure supplied to the upper air port 64 or the lower air port 62 of the air body 42 is between about 30 to 100 psi. The air pressure supplied to the air inlet port 80 of the atomizing air body is about 0 to 35 psi.

Figure 3:
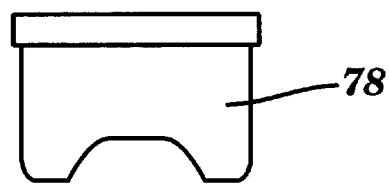
FIG. 3 is a front elevational view of an atomizing air cap configured to provide a flat spray pattern.
Figure 4:
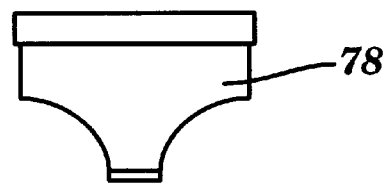
FIG. 4 is a side view of the atomizing air cap of FIG. 3.
Figure 5:
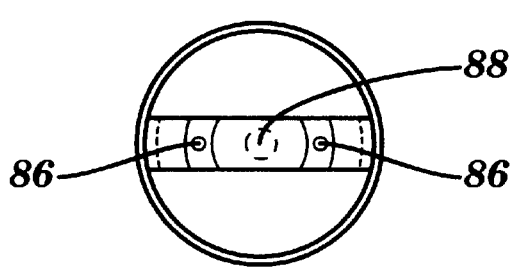
FIG. 5 is a bottom view of the atomizing air cap of FIG. 3.
Figure 7:
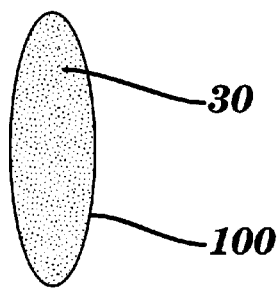
FIG. 7 is a top view of the flat spray pattern produced using the atomizing air cap of FIG. 3.
Figure 6:
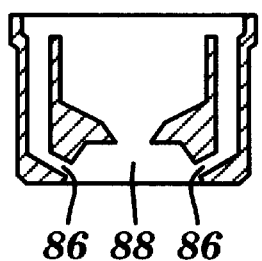
FIG. 6 is a cross-sectional view of the atomizing air cap of FIG. 3.

FIGS. 3 and 4 provide front and side views of a first embodiment of an atomizing air cap 78 that provides a flat spray pattern 100 as illustrated in FIG. 7. FIG. 5 is a bottom view of the atomizing air cap 78, showing the side and central air passages 86 and 88. FIG. 6 is a cross-sectional view of the atomizing air cap 78. The central air passage 88 primarily supplies air to atomize the fluid material 30, while the side air passages 86 atomize and shape the spray pattern of the fluid material 30.

Figure 8:
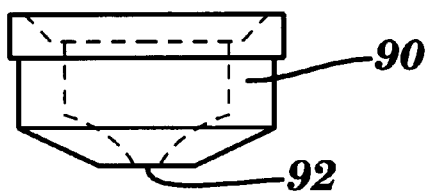
FIG. 8 is a front elevational view of an atomizing air cap configured to provide a round spray pattern.
Figure 10:
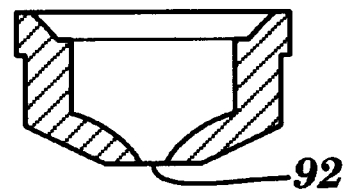
FIG. 10 is a cross-sectional view of the atomizing air cap of FIG. 8.
Figure 9:
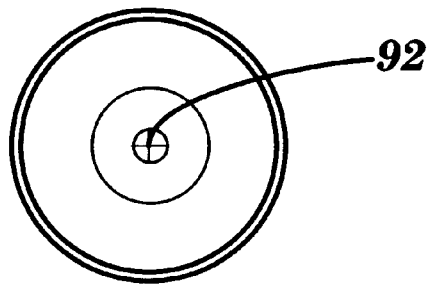
FIG. 9 is a bottom view of the atomizing air cap of FIG. 8.
Figure 11:
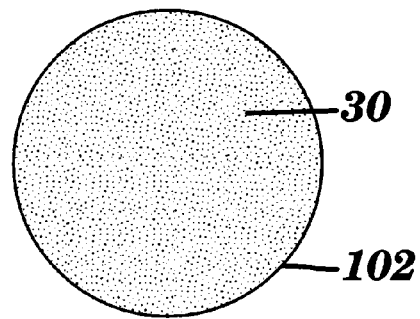
FIG. 11 is a top view of the round spray pattern produced using the atomizing air cap of FIG. 8.

FIGS. 8, 9 and 10 illustrate an alternate embodiment of an atomizing air cap 90 that produces a round spray pattern 102 as shown in FIG. 11. A central atomizing air passageway 92 is provided to both atomize the fluid material 30 and shape the spray into a round pattern.

The foregoing description of the present invention has been presented for purposes of illustration and description. It is not intended to be exhaustive or to limit the invention to the precise form disclosed, and many modifications and variations are possible in light of the above teaching. For example compressed air is used to atomize the material into a spray, however other methods such as the use of ultrasound could accomplish the same operation. Such modifications and variations that may be apparent to a person skilled in the art are intended to be included within the scope of this invention as defined by the accompanying claims.

What is claimed is:

1. A spraying and dispensing apparatus comprising:

a system for discharging material through an outlet;

a positioning system for positioning the outlet of the material discharging system in a first location for spraying the material onto a surface, and for positioning the outlet of the material discharging system in a second location for dispensing the material in a non-atomized state onto the surface, the positioning system including a base support and a system for displacing the material discharging system relative to the base support to displace the outlet of the material discharging system between the first and second locations; and a spray producing system attached to the base support in the first location, wherein the positioning system positions the outlet of the material discharging system within the spray producing system for spraying the material onto the surface.

2. The spraying and dispensing apparatus according to claim 1, wherein the spray producing system comprises a system for atomizing the material and for directing the atomized material onto the surface in a predetermined spray pattern.

3. The spraying and dispensing apparatus according to claim 1, further including a material control system for selectively supplying the material to the material discharging system.

4. The spraying and dispensing apparatus according to claim 3, wherein the material control system includes a material inlet and a valve system for selectively supplying the material from the material inlet to the material discharging system.

5. The spraying and dispensing apparatus according to claim 4, wherein the valve system further includes a valve seat, a control member, and a system for selectively positioning the control member relative to the valve seat to control the passage of the material from the material inlet to the material discharging system.

6. The spraying and dispensing apparatus according to claim 5, wherein the valve system includes a biasing mechanism for automatically positioning the control member in the valve seat to prevent the material from passing from the material inlet to the material discharging system.

7. The spraying and dispensing apparatus according to claim 1, wherein the system for displacing the material discharging system additionally displaces a material control system relative to the base support.

8. The spraying and dispensing apparatus of claim 1, wherein the spraying and dispensing apparatus is attached to a multi-degree of freedom positioning apparatus system.

9. A spraying and dispensing apparatus comprising:
a supply of material to be sprayed or dispensed on a surface;
a needle having an outlet for discharging the material through the outlet; and
a positioning system for positioning the outlet of the needle in a first location within a spray producing system for spraying the material onto the surface, and for positioning the outlet of the needle in a second location outside of the spray producing system for dispensing the material onto the surface in a non-atomized state.

10. The spraying and dispensing apparatus of claim 9, further including a material control system for selectively supplying the material to the needle.

11. The spraying and dispensing apparatus according to claim 10, wherein the material control system includes a material inlet and a valve system for selectively supplying the material from the material inlet to the needle.

12. The spraying and dispensing apparatus according to claim 11, wherein the valve system further includes a valve seat, a control member, and a system for selectively positioning the control member relative to the valve seat to control the passage of the material from the material inlet to the needle.

13. The spraying and dispensing apparatus according to claim 12, wherein the positioning system for positioning the control member inserts an end portion of the control member in the valve seat to prevent the material from passing from the material inlet to the needle, and wherein the positioning system for positioning the control member withdraws the end portion of the control member from the valve seat to allow the material to pass from the material inlet to the needle.

14. The spraying and dispensing apparatus according to claim 12, wherein the valve system includes a biasing mechanism for automatically positioning the control member in the valve seat to prevent the material from passing from the material inlet to the needle.

15. The spraying and dispensing system according to claim 9, wherein the positioning system includes a base support and a system for displacing the needle relative to the base support to displace the outlet of the needle between the first and second locations.

16. The spraying and dispensing apparatus according to claim 9, wherein the spray producing system comprises a system for atomizing the material and for directing the atomized material onto the surface in a predetermined spray pattern.

17. The spraying and dispensing apparatus according to claim 9, wherein the spraying and dispensing apparatus is attached to a multi-degree of freedom positioning apparatus system.

18. A method for spraying and dispensing material, comprising the steps of:
providing a support of material;
providing a needle having an outlet through which the material is discharged;
positioning the outlet of the needle in a first location within a spray producing system to spray the material from the outlet of the needle onto a surface; and
positioning the outlet of the needle in a second location outside of the spray producing system to dispense the material onto the surface from the outlet in a non-atomized state.

19. The method for spraying and dispensing material according to claim 18, further including the step of:
selectively supplying the material to the needle.

20. A spraying and dispensing apparatus comprising:
a system for discharging material through an outlet of a needle;
a positioning system for positioning the outlet of the needle in a first location in a spray producing system for spraying the material onto a surface, and for positioning the outlet of the needle in a second location outside of the spray producing system for dispensing the material onto the surface in a non-atomized state;
a material control system for selectively supplying the material to the needle;
wherein the material control system includes a material inlet and a valve system for selectively supplying the material from the material inlet to the needle;
wherein the valve system further includes a valve seat, a control member, and a system for selectively positioning the control member relative to the valve seat to control the passage of the material from the material inlet to the needle; and
wherein the positioning system inserts an end portion of the control member in the valve seat to prevent the material from passing from the material inlet to the needle, and wherein the positioning system withdraws the end portion of the control member from the valve seat to allow the material to pass from the material inlet to the needle.

21. The spraying and dispensing system according to claim 20, wherein the spray producing system comprises a system for atomizing the material and for directing the atomized material onto the surface in a predetermined spray pattern.

22. The spraying and dispensing system according to claim 20, wherein the positioning system includes a base support and a system for displacing the needle relative to the base support to displace the outlet of the needle between the first and second locations.

23. The spraying and dispensing apparatus according to claim 22, wherein the spray producing system is attached to the base support in the first location.

24. The spraying and dispensing apparatus according to claim 22, wherein the system for displacing the needle additionally displaces the material control system relative to the base support.

25. The spraying and dispensing apparatus according to claim 21, wherein the spraying and dispensing apparatus is attached to a multi-degree of freedom positioning apparatus system.

* * * * *